United States Patent [19]

Becker et al.

[11] 4,425,074
[45] Jan. 10, 1984

[54] METHODS OF AND APPARATUS FOR TRANSFERRING ARTICLES

[75] Inventors: Alan R. Becker, Coopersburg; Jack J. Monahan, Allentown; Fred J. Schneider, Northampton, all of Pa.

[73] Assignee: Western Electric Co., Inc., New York, N.Y.

[21] Appl. No.: 284,886

[22] Filed: Jul. 20, 1981

[51] Int. Cl.$^3$ ............................................. B65G 41/00
[52] U.S. Cl. .................................... 414/736; 198/486; 414/752
[58] Field of Search ............... 414/627, 736, 737, 738, 414/743, 744 B, 749, 750, 752; 198/486, 458; 294/64 R, 65.1, 81 R, 99 S; 271/9, 107, 92, 91

[56] References Cited

U.S. PATENT DOCUMENTS

| | | | |
|---|---|---|---|
| 3,360,102 | 12/1967 | Cummings | 198/486 X |
| 3,448,865 | 6/1969 | Schroder | 414/751 X |
| 3,506,140 | 4/1970 | Koch et al. | 414/736 |
| 3,542,224 | 11/1970 | Warren | 198/458 X |
| 3,580,442 | 5/1971 | Rohdin et al. | 198/486 X |
| 4,117,912 | 10/1978 | Ruppe | 188/72.3 X |
| 4,119,211 | 10/1978 | Boyer et al. | 198/486 X |

Primary Examiner—Robert J. Spar
Assistant Examiner—Donald W. Underwood
Attorney, Agent, or Firm—W. O. Schellin; D. C. Watson

[57] ABSTRACT

Articles (18) are transferred from a first position, such as a feed track (37) on which they are located closely spaced, to a second position such as a heat seal apparatus. At the heat seal apparatus the spacing of the articles is to coincide with the spacing of frame members (32) to which the articles are to be joined. The change in the spacing occurs during the transfer of the articles from the first to the second positions by means of a transfer mechanism (41). A plurality of pickup members (43) are slideably mounted to an arm (44) of the mechanism (41). The pickup members (42) which are resiliently urged apart with respect to each other are forced together at one end of the travel of the arm (44) to assume the close spacing established by the width of the pickup members. At the other end of the travel of the arm (44) the resilient urging force drives the pickup members (43) against predetermined stop positions.

5 Claims, 8 Drawing Figures

METHODS OF AND APPARATUS FOR TRANSFERRING ARTICLES

TECHNICAL FIELD

This invention relates to methods of and apparatus for transferring articles. More particularly, the invention relates to methods of and apparatus for transferring a plurality of articles from a first position at a first spacing to a second position at a second spacing. The invention is particularly described with respect to handling thermoplastic sealing caps for hybrid integrated circuits. However, the description of the invention in terms of the particular example serves illustrative purposes only and is not intended to be limiting to the scope of the invention.

BACKGROUND OF THE INVENTION

Over the years, electronic device manufacturing has developed into a highly sophisticated and automated technology. In some instances, however, operators still perform manual assembly operations. One such operation is a heat-seal operation for packaging a dual-in-line package (DIP) integrated circuit formed on a ceramic substrate. During the heat-seal operation, a plastic cap is placed and sealed against the active (or circuit) side of a rectangular ceramic circuit substrate. Outward extending leads are cut from a frame and are bent down against the edges of the plastic cap to form the typical shape of the DIP. Prior to the heat-seal operation, the ceramic substrate is bonded to the horizontally extending leads of a lead frame. The lead frame is, in a preferred handling technique, one in a short strip of eight frames cut from a strip of indefinite length.

The heat-seal caps are rectangular caps of the same size as the DIPs. Tabs extend perpendicularly from the caps along the two longer edges thereof to fit between the leads and to become formed around the edges of the ceramic substrate. In the previously mentioned heat-seal operation, eight of the caps are placed manually into eight spaced nests which correspond in their spacing precisely to the spacing of the lead frames in the strip of lead frames. A respective lead frame is then placed over the caps. A subsequent operation seals the caps to the substrates, cuts the leads from the frames and forms the leads after cutting into the typical DIP configuration.

Placing eight of the caps into the respective nests has been found to be time consuming and cumbersome. However, because of a desirably precise spacing of the caps as determined by the spacing of the lead frames in the strip, the loading operation of the caps has, in the past, remained a manual one.

SUMMARY OF THE INVENTION

In accordance with the present invention, a method of transferring a plurality of articles between first locations having first predetermined spacings and second locations having second predetermined spacings includes resiliently urging a plurality of pickup members away from each other. The pickup members are translated between the first and the second locations. As the pickup members are translated into alignment with the first locations, they are forced into contact with each other, such contact positioning the pickup members at intervals equal to said first spacings. Upon being translated to said second locations, the pickup members are urged away from each other, such spreading motion being arrested when said pickup members have assumed intervals equal to said second spacings.

Apparatus in accordance with the invention comprises a plurality of pickup members, each having a predetermined width. The members are movably mounted adjacent to one another. Resilient urging means bias the pickup members apart and away from a reference pickup member and against respective, precisely spaced stops. The stops position the pickup members in alignment with predetermined expanded transfer locations. A frame is movably mounted to translate between such expanded transfer locations and close transfer locations. Provisions are made to translate the frame including the pickup members to the close transfer locations. A stop member at the close transfer locations engages one of the pickup members such that the pickup members are forced into contact with each other between the stop member and the reference pickup member, whereby the predetermined widths of the pickup members locate the pickup members at intervals which correspond to the spacings of the close transfer locations.

BRIEF DESCRIPTION OF THE DRAWINGS

Other features and advantages of the invention will be best understood from the following detailed description when read in conjunction with the appended drawing wherein.

DETAILED DESCRIPTION

Figure 1:
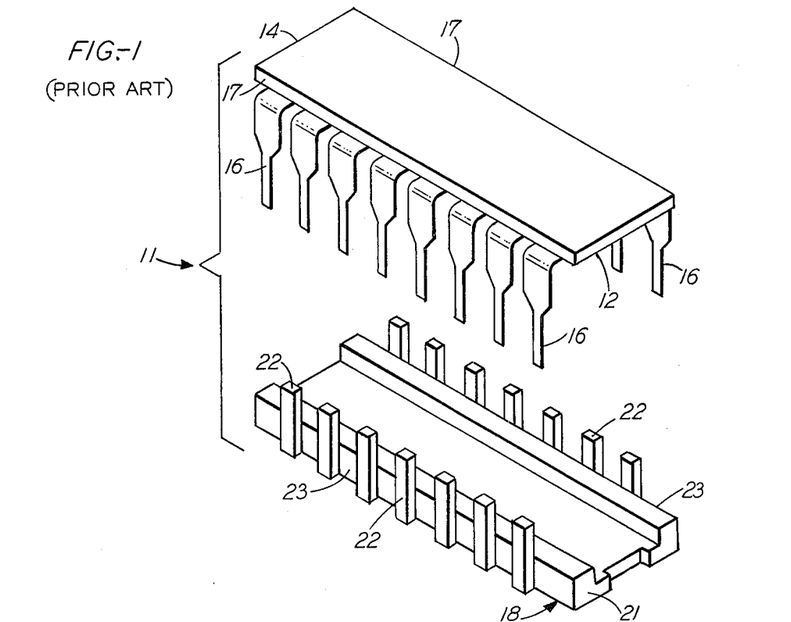
FIG. 1 is a typical article of manufacture to which the invention advantageously applies.

Referring now to FIG. 1, there is shown in an exploded view a hybrid integrated circuit package, which is designated generally by the numeral 11. The package 11 is of a configuration which is typically referred to as "dual-in-line package" or DIP. The package 11 is further of a type which has an interconnecting circuit 12 located on the underside of a ceramic substrate 14. The circuit typically includes various passive components such as resistors or capacitors which are formed directly on the substrate 14. One or more active components, typically semiconductive integrated circuits, are bonded to predetermined bond sites of the circuit 12 to become an integral part thereof. The substrate is then joined to a lead frame which is typically part of a strip of several lead frames for easier handling. According to a particular packaging technique, the circuits 12 are further protected by covering them with a protective coating, such as a room temperature vulcanizing rubber compound.

The exploded view of FIG. 1 shows the typical component package 11 including the characteristically shaped leads 16 of the DIP. The leads 16 are bonded to the substrate 14 along two major edges 17 thereof and have been cut from the frame and formed downward at substantially right angles to the substrate 14.

Simultaneously with cutting and forming the leads 16, a thermoplastic cap 18 is assembled to the package 11 to cover the circuit 12 as an additional protection for the various component elements of the circuit 12 and to make the package 11 generally more rigid. A major body portion 21 of the cap 18 has substantially the same size as the substrate 14. Tines 22 extend from two major edges 23 of the body portion 21. The tines 22 are spaced to become interdigitated between the leads 16, and are sufficiently long to become heat-formed around the edges 17 of the substrate 14.

Figure 2:
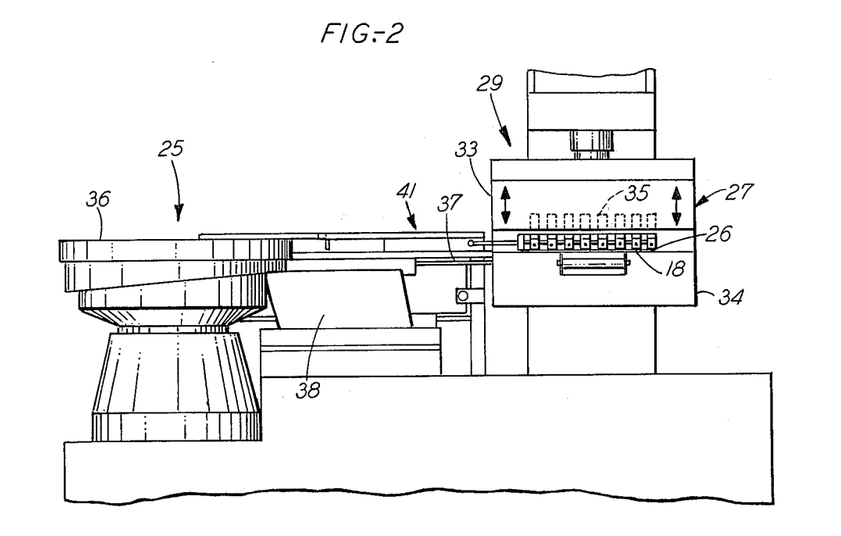
FIG. 2 is a heat seal and lead cutting apparatus including article transfer provisions in accordance with this invention.

In FIG. 2, there is shown a load and transfer mechanism, which is designated generally by the numeral 25, to position, for example, eight of the heat seal caps 18 on eight corresponding seats 26 of a heat seal and frame cutting die 27. FIG. 2 shows the mechanism 25 in relationship to a prior art heat seal apparatus 29 of which the die 27 is a major component, and FIG. 3 shows in greater detail one of the seats 26.

At the beginning of an operational cycle of the heat seal apparatus 29, a plurality of the caps 18 are positioned in the appropriately spaced seats 26 (see FIG. 3) such that the length of each of the caps 18 is collinearly aligned with that of the other caps 18 and the tines 22 face upward. A strip of lead frames, not shown, is placed over the caps 18. (In the preferred apparatus, eight lead frames holding eight integrated circuit substrates are placed over eight corresponding caps 18. Although the precise number of units is not critical, eight units are a convenient length.)

Figure 3:
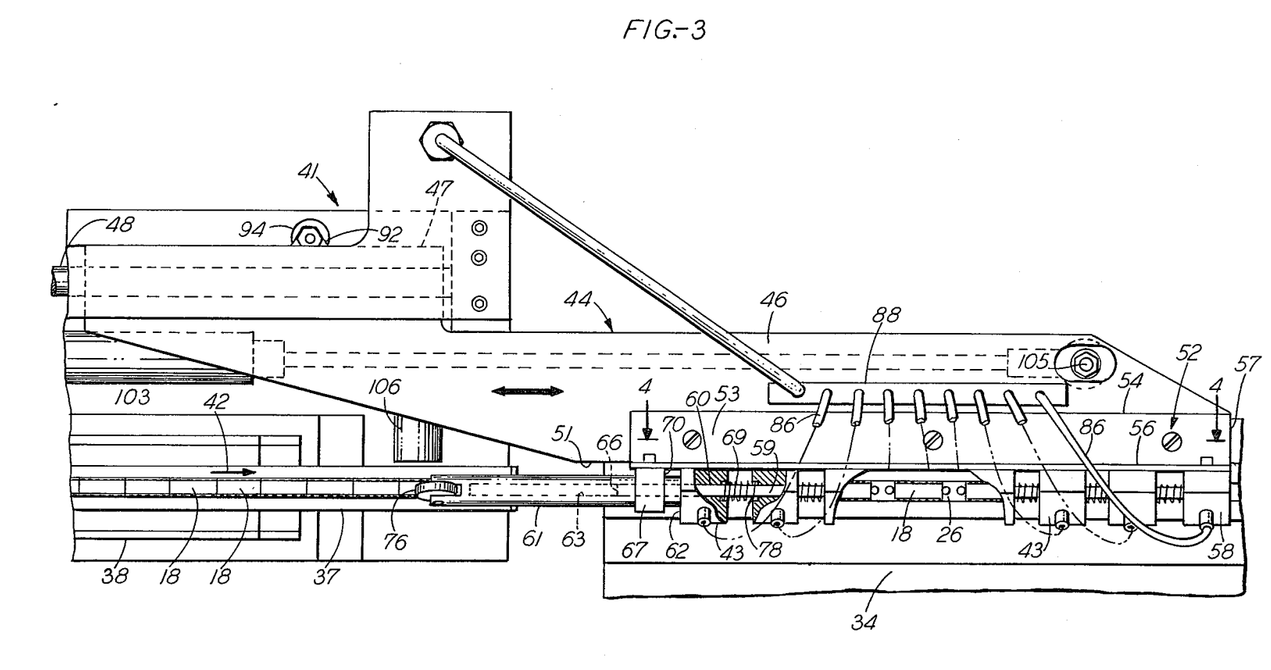
FIG. 3 shows in greater detail an article transfer mechanism including a plurality of pickup members of a vacuum pickup assembly supported in an expanded array on a transfer arm.

Referring to both FIGS. 2 and 3, upper portion 33 of the die 27 is then lowered against the lower portion 34 thereof. Cutting edges (not shown) sever, in a typical punch and die operation, the leads 16 from the frames and form the leads downward. Heating elements or thermodes 35 are incorporated in the upper portion 33 of the die. The thermodes' 35 heat softens the tines 22 of the caps as the body portions 21 of the caps 18 (see also FIG. 1) are urged against the undersides of the substrates 14. The tines 22 are then formed by the same compressing motion of the die 27 around the edges of the substrates 14. At the completion of this operation, which is referred to as a heat seal and lead cutting operation, the formed plastic tines 22 cool and harden. The substrate 14 and the cap 18 thereby become joined into a unitary structure.

A prior art, manual operation of loading the caps 18 into the seats 26 of the die, is now eliminated by the operation of the load and transfer mechanism 25 (see FIG. 2). A typical vibratory feeder bowl 36, as it is well known in the art, is a preferred means of feeding the caps 18 in sequence onto a track 37. Means other than the feeder bowl 36 may be used, such as, for example, a stick-like magazine. However, the feeder bowl 36 is preferred. Feeder bowls are readily refilled and operate reliably.

In FIG. 3, the caps 18 are shown advancing along the track 37. Preferably the track 37 is vibrated by a typical slanted electromechanical vibratory advancing unit 38 to drive the caps toward a front end of the track 37. A typical photocell 39 (see FIG. 5) or other monitoring device senses when the track 37 becomes packed with the caps 18. At that time, the vibratory motion of the feeder bowl 36 is turned off. The vibrating action of the feed track 37 is preferably maintained while a transfer mechanism 41 is in operation. For the transfer mechanism 41 to function properly, it is desirable for at least the caps 18 to be transferred to remain in adjacent contact with each other during such pickup. The vibratory motion of the vibrator unit 38 continuously drives the caps 18 toward such a contact with each other in the direction of the arrow 42 shown in FIG. 3.

Generally described, the transfer mechanism 41 engages a predetermined number of the caps 18 (in the preferred mechanism eight of the caps 18 are picked up simultaneously) at the end of the feed track 37 and transfers such engaged caps 18 to the respective seats 26 of the die 27. On the feed track 37 the caps are located in close contact adjacent to one another. The seats 26 of the die 27 are spaced, however, in accordance with the spacing of the lead frames. As the transfer mechanism 41 transfers the engaged caps 18, the spacing of the caps 18 is caused to change from such close or first spacing to an expanded spacing or second spacing to correspond to the spacing of the lead frames.

The transfer mechanism 41 provides a precise, predetermined change in the spacing of individual pickup members 43 as the transfer of the caps 18 between the first and second positions occurs. In the described, preferred example, the transfer occurs by picking up the closely spaced caps 18 on the track and advancing them to the seats 26 where the spacing is that of the wider spaced lead frames. It should be realized, however, that the operation of the mechanism could easily be reversed to pick up articles at a first, expanded or wider spacing and deposit them at a second, close spacing.

For a more detailed description of the transfer mechanism 41, reference is again made to FIG. 3. A top view of a portion of the transfer mechanism 41 in FIG. 3 depicts, in particular, a transfer arm 44 in its extended position. The arm 44 includes a mounting bracket 46 which is supported by a guide sleeve 47. Through the guide sleeve 47, the arm 44 becomes linearly movable along a guide shaft 48. The sleeve 47 is preferably supported on the shaft 48 by typical linear ball bearings, not shown.

The mounting bracket 46 is preferably of a heavy gauge aluminum plate. A lightweight structure is desirable. However, the bracket also has to be rigid, since the mounting bracket extends from the sleeve 47 as an unsupported cantilever. Mounted to an edge 51 of the bracket 46 is a vacuum pickup assembly 52. A frame 53 of the assembly 52 consists of a structural angle of aluminum. One flange 54 of the angle is mounted to the bracket 46 such that the second upright flange 56 of the angle increases the rigidity of the cantilevered portion of the bracket 46. At the most extended end 57 of the frame, one of the vacuum pickup members, specially identified by the numeral 58, is rigidly mounted to the upright flange 56. The rigidly mounted pickup member 58 supports a guide rod 59 which extends adjacent to and parallel to the flange 56 of the frame 53.

In the preferred embodiment, the remaining seven vacuum pickup members 43 are slidably mounted on the guide rod 59. Bearing surfaces 60 of such remaining pickup members 43 slidably rest against the flange 56 of the frame to prevent rotation of the pickup members 43 about the guide rod 59. The pickup member 43 on the opposite end from the rigidly mounted member 58 has an actuator sleeve 61 attached to an outer face 62. The actuator sleeve 61 is a tubular member, the inner bore 63 of which is capable of telescopingly receiving the end 66 of the guide rod 59, as shown in the partially sectioned view of FIG. 3. The actuator sleeve 61 itself is slidably mounted within a bushing 67 which in turn is mounted to the flange 56 on the end opposite from the end 57. Between the fixed pickup member 58 at one end of the frame 53 and the bushing 67 at the other end of the frame, the slidable pickup members 43 are urged away from the fixed pickup member and from each other by coil springs 69.

Figure 4:
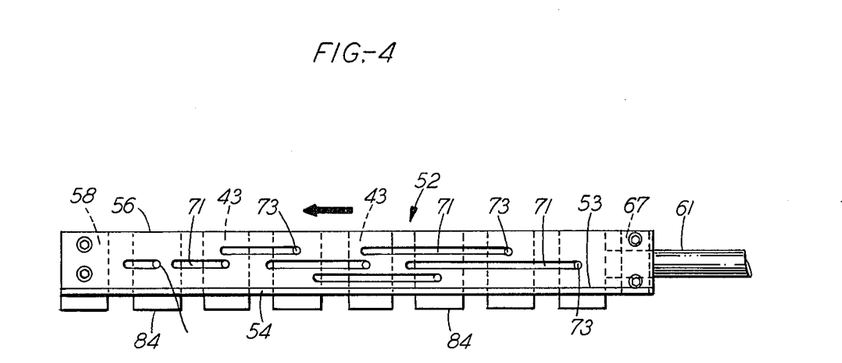
FIG. 4 is a partial view of the article transfer arm in an extended position showing a frame of the vacuum pickup assembly.

In theory, the urging force of the springs 69 would drive the pickup members apart until the face 62 of the outer movable pickup member 43 slides into contact with the adjacent face 70 of the bushing 67. However, the flange 56 features a plurality of slots 71 which are shown, for example, in FIG. 4. The view of the flange 56 in FIG. 4 is taken in the direction identified by the numerals "4—4" in FIG. 3. Each of the slots 71 is associated with one of the slidable pickup members 43. A pin 73 mounted in the bearing surfaces 60 of the pickup members 43 extends from each such surface 60 through the respective slot 71. As shown in FIG. 4, each of the pins 73 is urged against one end of its respective slot 71, such that the contact of the pins 73 with the ends of the slots 71 determines the spacing of the pickup members 43 when they are located in their expanded positions.

Figure 5:
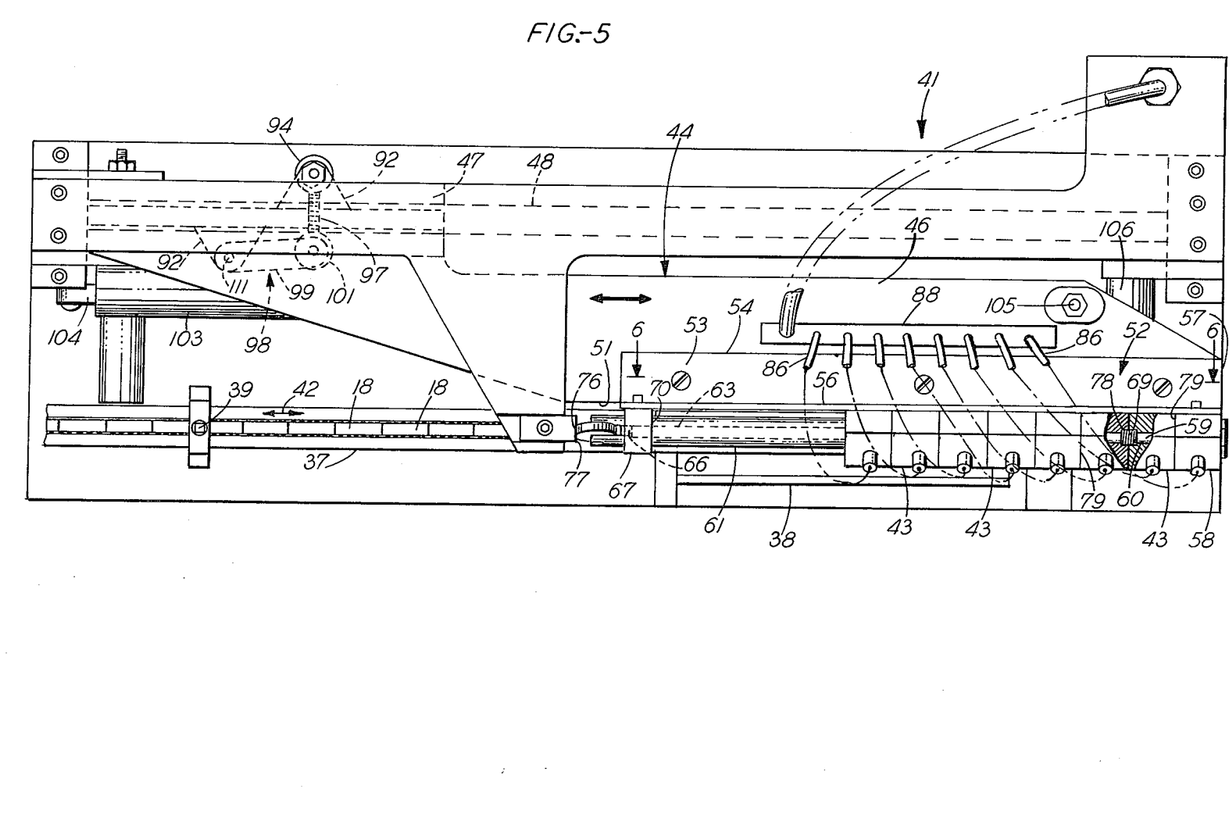
FIG. 5 is a top view of the transfer arm in a retracted position.
Figure 6:
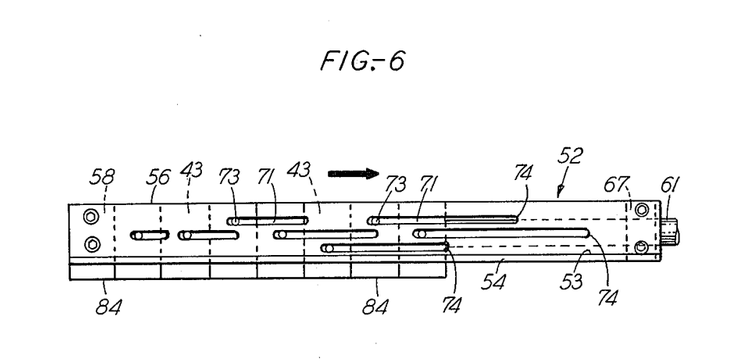
FIG. 6 is a partial view of the transfer arm such as in FIG. 4 except that the arm is in a retracted position.

All slots 71 are of different lengths; and the slot 71 closest to the fixed pickup member 43 is the shortest, while the slot 71 associated with the pickup member 43 must remote from the fixed pickup member is the longest. The lengths of the slots 71 are related to the distances through which the pickup members 43 travel between the expanded positions shown in FIGS. 3 and 4 and the close positions shown in FIGS. 5 and 6. FIGS. 4 and 6 further depict a convenient manner of arranging the slots 71 in the flange 56 of the frame 53. The slots 71 are formed at three different levels to accommodate a certain amount of overlap in the travel of the pickup members 43.

When the pickup members 43 are in their expanded positions, a precise dimensional relationship between the pickup members 43 depends on the precision with which the ends 74 of the slots 71 are formed with respect to each other. The close positions of the pickup members 43 are achieved, however, by forcing the pickup members 43 into contact with each other against the urging of the springs 69, as shown in FIGS. 5 and 6. In the close or compressed positions, precise dimensioning of the widths of the pickup members 43 determines the precision of the spacing or pitch of the pickup members 43.

In FIG. 5, the transfer arm 44 is shown in its retracted position. During the movement of the arm 44 from the expanded position to the retracted position shown in FIG. 5, an end 76 of the actuator sleeve 61 moves into abutting contact with a stop lug 77. No longer capable of further joint movement with the transfer arm 44, the actuator sleeve moves relative to the arm 44, compressing the pickup members 43 against each other, against the urging forces of the springs 69. As the compressing motion takes place, the actuator sleeve 61 telescopes over the guide rod 59 until the arm 44 is in its fully retracted position.

Close contact between adjacent ones of the pickup members is possible because of a cylindrical recess 78 formed about the guide rod 59 in each of the lateral surfaces 79 of the pickup members 43. The recesses 78 form a seat or receptacle for the springs 69. Each of the recesses 78 accepts one half of the volume of one of the compressed springs 69 when the pickup members 43 are moved into close contact with each other.

After the pickup members 43 have moved into close contact with each other, further movement of the transfer arm 44 stops. Solid contact between all members from the stop lug 77 to the outermost pickup member 58, prevents any further retracting movement of the arm 44. The shock of the sudden stop of the transfer arm 44 is reduced, however, by the increased spring force of the now compressed springs 69 between the pickup members.

Referring now to FIG. 6, the retracting movement of the arm 44 compressing the pickup members 43 into contact with each other has caused the pins 73 to traverse substantially the full length of each slot 71. The slots 71, however, are formed slightly longer than necessary to move the pickup members 43 into close contact with each other. The pins 73 are, consequently, never urged against the ends of the slots 71 at the end of the retracting movement of the arm. On the extended end of the travel of the arm 44, however, the movement of the arm is not arrested through the interaction of the pickup members 43.

Figure 7:
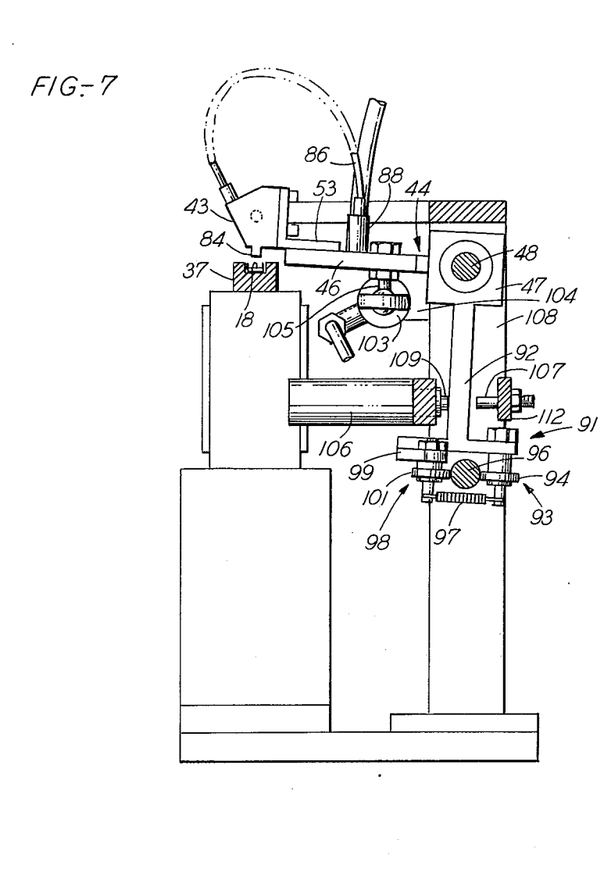
FIG. 7 is an end view of the transfer arm and a support frame thereof, showing the arm in a raised transfer position.
Figure 8:
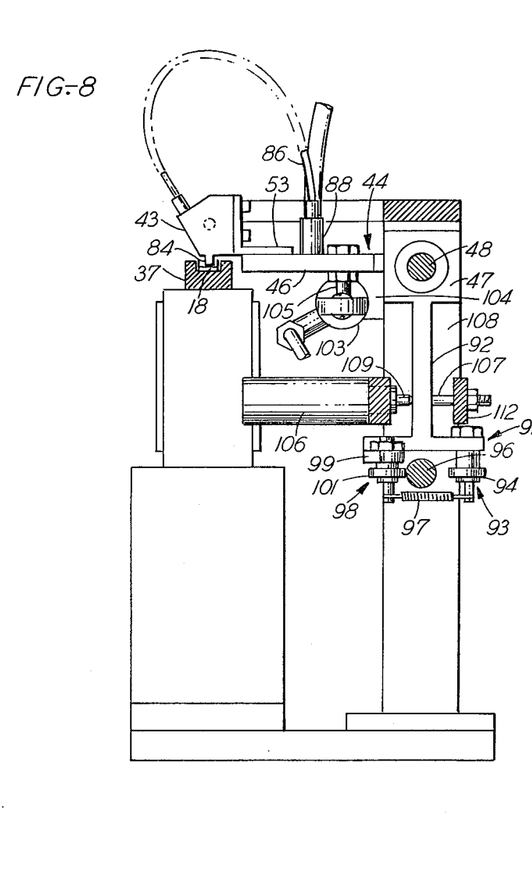
FIG. 8 is an end view of the transfer arm such as in FIG. 7, except that the arm is in a downward pivoted position.

A vertical or pivotal motion of the transfer arm 44 is best explained in reference to FIGS. 7 and 8. Such pivotal motion is executed at the beginning and at the end of each horizontal arm movement to either pick up or to deposit a plurality of the caps 18. FIG. 7 shows the transfer arm 44 in its normal, upward pivoted position. In such upward pivoted position, the pickup members 43 are clear of the track 37 at one end of travel of the arm as shown in FIG. 7, or of the seats 26 at the other end of travel.

FIG. 7 shows an end view of the mounting bracket 46 including the frame 53. The end view further shows lower vacuum tips 84 which depend downward from each of the pickup members 43. The vacuum provisions for picking up the caps from the feed track 37 and releasing them at the respective seats of the die are similar to selectively operated vacuum provisions for holding semiconductor chips, for example. Typical vacuum openings in the tips 84 are coupled through typical pneumatic tubing 86 to a common manifold 88, which is also shown in the top views of the arm 44 in FIGS. 3 and 5. The manifold, in turn, is coupled to an appropriate vacuum source (not shown). At the appropriate times in the operational cycle of the apparatus 29, shown in FIG. 2, the vacuum to the tips 84 is turned on to pick up the caps 18 from the track 37. To deliver the caps, the vacuum is turned off when the arm has positioned the caps 18 in the seats 26.

Of particular interest in FIG. 7 is a vertical guiding and positioning mechanism 91 which depends from the guide sleeve 47. A downwardly depending support 92 has fixedly mounted thereto a guide roller assembly 93. A roller 94 of the assembly 93 is normally drawn against a position control shaft 96. Contact between the roller 94 and the control shaft 96 is the result of the force of a tension spring 97 mounted between the roller assembly 93 and a counter roller assembly 98, which is pivotally mounted through a hinge link 99 (see also FIG. 5) to the support 92.

Thus, when both the roller 94 and a roller 101 of the counter roller assembly 98 are in contact with the control shaft 96 on opposite sides thereof, the pickup members 43 are in the raised position and free to travel horizontally. Horizontal movement of the arm 44 between the extended and the retracted positions is preferably generated by a typical linear actuator, such as a bidirectionally powered air cylinder 103, which is also shown in its extended position in FIG. 3. The cylinder is mounted between fixed supports 104 of the transfer arm mechanism 41 and a post 105 on the mounting bracket 46 of the arm 44 (see FIGS. 3 and 5).

In the extended and in the retracted positions of the arm 44, the support 92 becomes located between linear push actuators 106 and corresponding backstops 107. FIGS. 7 and 8 show one of the actuators 106 and its corresponding backstop 107 associated with the retracted position of the arm 44. The actuator 106 and the corresponding backstop 107 are fixedly mounted to frame members 108 of the transfer arm mechanism 41.

When the actuator 106 is energized (as shown in FIG. 8), a plunger 109 is forced by, for example, compressed air, against the adjacent support 92 and continues its thrust to urge the support 92 toward the backstop 107. Such motion of the support 92 is possible because of the resilient yield between the rollers 94 and 101. As the plunger 109 urges the support 92 toward the backstop 107, the roller 94 is separated from contact with the control shaft 96. The roller 101 remains in contact with the shaft 96 while the hinge link 99 pivots about a mounting axis 111 on the support 92.

The motion of the plunger 109 continues until the support 92 is forced into contact with the backstop 107 as it is shown in FIG. 8. The resulting motion of the arm 44 is a bellcrank-type pivoting of the arm about the guide shaft 48, moving the pickup members 43 into contact with respective caps 18 located on the feed track 37. While the arm 44 is in the downward pivoted position, the support 92 remains pinched between the plunger 109 and the backstop 107.

The backstop 107 itself is a threaded member which is adjustably mounted in a bracket 112. Turning the backstop 107 permits a precise adjustment of the vertical positions of the pickup members 43 in relationship to the feed track 37 and the seats 26. Since separate push actuators 106 and backstops 107 are mounted at each end of the movement of the arm 44, the depth to which the pickup members 43 dip toward the feed track 37 is separately adjustable from the depth to which the pickup members 43 dip when in vertical alignment with the seats 26 of the heat sealing apparatus.

When the linear actuator 106 is deactivated, the tension of the springs 97 pulls the roller 94 toward the roller 101 and into contact with the shaft 96. The support 92 is thereby pivoted about the guide shaft 48, lifting the arm 44 and the pickup members 43 upward in the bell crank-like manner to the raised position as shown in FIG. 7. The deactivation of the linear actuator 106 also releases the support 92 from the clamping grasp between the plunger 109 of the actuator and the corresponding backstop 107. The arm 44 is thereby freed to travel between the feed track 37 and the seats 26 of the die 27 as shown in FIG. 2.

Various changes and alterations in the described structural elements and the mode of operation are, of course, possible without departing from the spirit and scope of this invention.

What is claimed is:

1. A method of transferring a plurality of articles between first locations having first predetermined spacings and second locations having second predetermined spacings, which comprises:
    moving a support structure to advance a first pickup member, fixedly mounted to said support structure, between an end location of said first locations and a corresponding end location of said second locations;
    guidedly supporting in linear extension from said first pickup member a plurality of second pickup members, each such member having a predetermined width;
    resiliently urging apart said plurality of second pickup members from each other and from said first pickup member;
    compressing into adjacent contact said first and said plurality of second pickup members with a force overcoming said resilient urging, whereby said predetermined widths of said pickup members establish an alignment of each of said pickup members with a respective one of said first locations;
    on movement of said first pickup member from said end location of said first location, moving said plurality of second pickup members from alignment with said first locations toward alignment with said second locations and releasing said compressive force during such movement thereby generating relative movement between all of said pickup members;
    arresting such relative movement between said plurality of pickup members in response to said resilient urging at predetermined positions of the second pickup members relative to each other and to said first pickup member by engaging a protrusion from each of the second pickup members with a respective one of a plurality of stop surfaces located in such support structure, each of such stop surfaces being precisely located relative to such first pickup member and relative to such other stop surfaces, such that the spacing between said predetermined positions corresponds to said second predetermined spacings; and
    selectively activating and deactivating the pickup members to engage and release said articles at said first and second locations.

2. A method of transferring a plurality of articles according to claim 1, wherein compressing comprises:
    moving said first pickup member and said second pickup members in the direction of their linear extension from said first pickup member;
    engaging a foremost one of said pickup members with a stop lug; and
    continuing the movement of the remaining ones of said pickup members until such members have moved into close contact with each other.

3. A method of transferring a plurality of articles according to claim 1, wherein moving the support structure comprises moving the support structure between a retracted and an extended position into alignment with a fixedly mounted actuator at each of such positions and guiding the support structure along a position control structure to retain the orientation of the first pickup member, and wherein selectively activating and deactivating comprises:
    upon said pickup members having moved into respective ones of said first and second positions, urging said support structure away from the position control structure to impart movement to such pickup members in a direction perpendicular to the motion of the pickup members between said first and second positions and in a direction toward a transfer location of such articles;

activating a vacuum in such pickup members to engage the articles with such pickup members, and deactivating the vacuum to disengage the articles from the pickup members after such movement has been imparted; and returning the support structure to the position control structure prior to moving the support structure between said first and second locations.

4. Apparatus for transferring a plurality of articles between first locations having first predetermined spacings and second locations having second predetermined spacings, which comprises:

a first and a plurality of linearly arranged second pickup members each of said second pickup members having a width corresponding to said first predetermined spacing, said second pickup members being movably mounted to move with respect to said first pickup member and with respect to one another;

means for resiliently urging adjacent ones of said first and second pickup members away from each other;

means, acting on an outer one of the second pickup members and on said first pickup member, for moving the pickup members toward each other and into contact with each other against a force exerted by said urging means, whereby the pickup members become spaced according to the first predetermined spacings, and for moving said first pickup member away from such second pickup members to allow such urging means to move said first and second pickup members away from each other;

means, including a protrusion on each of said second pickup members and corresponding stop surfaces located in a support at predetermined distances from each other and from said first pickup member, said support coupled to said moving means, each of said stop surfaces positioned in the path of a corresponding one of said protrusions on said second pickup members for stopping the relative movement of each of said pickup members in response to said urging means at predetermined intervals between each two adjacent ones of the pickup members, said intervals corresponding to said second predetermined spacings, whereby the pickup members assume said second predetermined spacings; and means for translating said moving means between two positions for aligning said pickup members with said first locations whenever the pickup members are in contact with each other and for aligning said pickup members with said second locations whenever the pickup members have assumed said second predetermined spacings.

5. Apparatus for transferring a plurality of articles according to claim 4, wherein means for resiliently urging adjacent ones of said pickup members away from each other comprises:

a plurality of springs interposed between such adjacent ones of said pickup members, each of said pickup member having cavities in adjacent surfaces thereof for storing said springs in their compressed state while adjacent ones of the pickup members are in contact with each other.

* * * * *